United States Patent
Khusnatdinov

(10) Patent No.: US 10,131,134 B2
(45) Date of Patent: Nov. 20, 2018

(54) SYSTEM AND METHOD FOR DISCHARGING ELECTROSTATIC CHARGE IN NANOIMPRINT LITHOGRAPHY PROCESSES

(71) Applicant: CANON KABUSHIKI KAISHA, Tokyo (JP)

(72) Inventor: Niyaz Khusnatdinov, Round Rock, TX (US)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 15/000,877

(22) Filed: Jan. 19, 2016

(65) Prior Publication Data

US 2017/0120572 A1 May 4, 2017

Related U.S. Application Data

(60) Provisional application No. 62/248,749, filed on Oct. 30, 2015.

(51) Int. Cl.
*G03F 7/00* (2006.01)
*B41C 1/10* (2006.01)

(52) U.S. Cl.
CPC .......... *B41C 1/1058* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 3,013,878 A | * | 12/1961 | Dessauer ............ G03G 15/169 |
| | | | 430/125.32 |
| 3,733,489 A | * | 5/1973 | Berk ...................... G04F 5/16 |
| | | | 250/359.1 |
| 6,407,382 B1 | | 6/2002 | Spangler |
| 6,873,087 B1 | | 3/2005 | Choi et al. |
| 6,932,934 B2 | | 8/2005 | Choi et al. |
| 6,936,194 B2 | | 8/2005 | Watts |
| 7,077,992 B2 | | 7/2006 | Sreenivasan et al. |
| 7,157,036 B2 | | 1/2007 | Choi et al. |
| 8,076,386 B2 | | 12/2011 | Xu et al. |
| 8,226,392 B2 | * | 7/2012 | Kawakami ............ B29C 43/003 |
| | | | 425/135 |
| 8,349,241 B2 | | 1/2013 | Sreenivasan et al. |
| 2004/0007799 A1 | | 1/2004 | Choi et al. |
| 2004/0188381 A1 | | 9/2004 | Sreenivasan |
| 2004/0211754 A1 | | 10/2004 | Sreenivasan |
| 2006/0176642 A1 | * | 8/2006 | George ................... B03C 3/011 |
| | | | 361/220 |

(Continued)

FOREIGN PATENT DOCUMENTS

WO   WO-2005/010271   2/2005

OTHER PUBLICATIONS

Wolfe et al., Neutral particle lithography: a simple solution to charge-related artefacts in ion beam proximity printing, J. Phys. D: Appl. Phys. 41 024007. Jan. 4, 2008.

(Continued)

*Primary Examiner* — Joshua D Zimmerman
(74) *Attorney, Agent, or Firm* — Cameron A. King; Daniel Ratoff

(57) ABSTRACT

Apparatus, systems and methods that use alpha-ionizers to discharge electrostatic charge accumulated on the working surfaces of imprint lithography templates and/or substrates.

21 Claims, 5 Drawing Sheets

(56) References Cited

U.S. PATENT DOCUMENTS

| | | | |
|---|---|---|---|
| 2008/0299878 A1* | 12/2008 | Ward | B24B 37/04 451/288 |
| 2010/0181289 A1 | 7/2010 | Sreenivasan et al. | |
| 2013/0214452 A1 | 8/2013 | Choi et al. | |
| 2014/0314897 A1 | 10/2014 | Ahn et al. | |

OTHER PUBLICATIONS

International Sarch Authority, Written Opinion for PCT/US2016/057343, dated Dec. 23, 2016.

* cited by examiner

SYSTEM AND METHOD FOR DISCHARGING ELECTROSTATIC CHARGE IN NANOIMPRINT LITHOGRAPHY PROCESSES

REFERENCE TO RELATED APPLICATION

This patent application claims priority to U.S. Provisional Application Ser. No. 62/248,749 filed Oct. 30, 2015, which is incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices, such as MRAM, 3D cross-point memory, Re-RAM, Fe-RAM, STT-RAM, and the like. Exemplary nanoimprint lithography processes are described in detail in numerous publications, such as U.S. Pat. No. 8,349,241, U.S. Pat. No. 8,066,930, and U.S. Pat. No. 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, resist removal, dicing, bonding, and packaging, and the like.

Separation of the template from the solidified layer, however, can generate an electrostatic charge on one or both of the separated surfaces. This is due to the electrochemical potential difference between the two involved materials, a phenomenon also known to explain tribology effect. This electrostatic charge occurs as two different materials (here, the template and the solidified layer) are in friction with each other and then separate, thereby generating electrostatic charge. The electrostatic charge generated on the template and on the solidified layer, in turn, causes unwanted electrostatic attraction of different kinds of particulates from the air or surrounding environment. These particulates, once accumulated onto the template or solidified layer, in turn cause defects during subsequent imprinting and/or substrate processing, resulting in reduced imprint quality, device failure, template damage, and other associated problems.

Prior attempts to use ionized gas to discharge templates, such as depicted in U.S. Pat. No. 8,226,392, rely on establishing a flow of an ionized gas to the template. However, such ionized gas is understood to be generated by a corona (or high voltage) discharge from a metal conductor, which itself creates undesirable particles that can migrate to the template surface and cause damage and/or process defects. Such particles arise either through a direct metal sputtering mechanism or through thermal cracking of oxides or other deposits that accumulate on the conductor. However, efforts to alleviate the impact of generated particles, such as increasing the working distance from the template surface or providing for particle filtration end up reducing the effective ion concentration such that the effective discharge time becomes much longer than a typical imprint process time (i.e., a few seconds) to be practically useful for nanoimprint applications.

There are other techniques for generation of ionized air like x-rays, UV light, γ-radiation that are likewise unsuitable for nanoimprint lithography. While these techniques do not produce harmful particulates, they still do not produce enough ion concentration in air to yield an effective discharge rate for nanoimprint applications. Thus remains a need for more effective discharge systems and techniques for nanoimprint lithography.

SUMMARY OF THE INVENTION

The present invention meets these and other needs in providing for an apparatus and methods that advantageously provide for effective discharge of imprint lithography templates and/or substrates.

In one aspect of the invention, an apparatus is provided for performing imprint lithography processes. The apparatus includes an alpha-ionizer and grounded conductor arranged on a motion stage that is translatable to position the alpha-ionizer in superimposition with a retained imprint template. The alpha-ionizer creates an electrically neutral plasma field between the imprint template patterning surface and the conductor to discharge accumulated electric charge on the template to ground. Rapid discharge can occur in as little as 1 second, well within process parameters for high-throughput imprint lithography processes. The discharge scheme further avoids conditions that give rise to the introduction of harmful particulates into the imprint lithography process. In a further aspect of the invention, the apparatus includes an additional alpha-ionizer and grounded conductor that are configured for superimposition with the imprinted pattern layer formed on the substrate, to likewise discharge to ground any electric charge accumulated on the substrate.

In further aspects, methods are provided for discharging electrostatic charge on an imprint template and/or substrate that include creating an electrically neutral plasma field between the imprint template patterning surface and a conductor so as to discharge accumulated electric charge on the template or substrate to ground. In certain aspects, such methods incorporate the use of the provided apparatus. Such methods can be used in imprint lithography processes to manufacture, among other things, devices and replica templates.

Further features and aspects of the present invention will be apparent from the following description of exemplary embodiments and with reference to the attached drawings.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
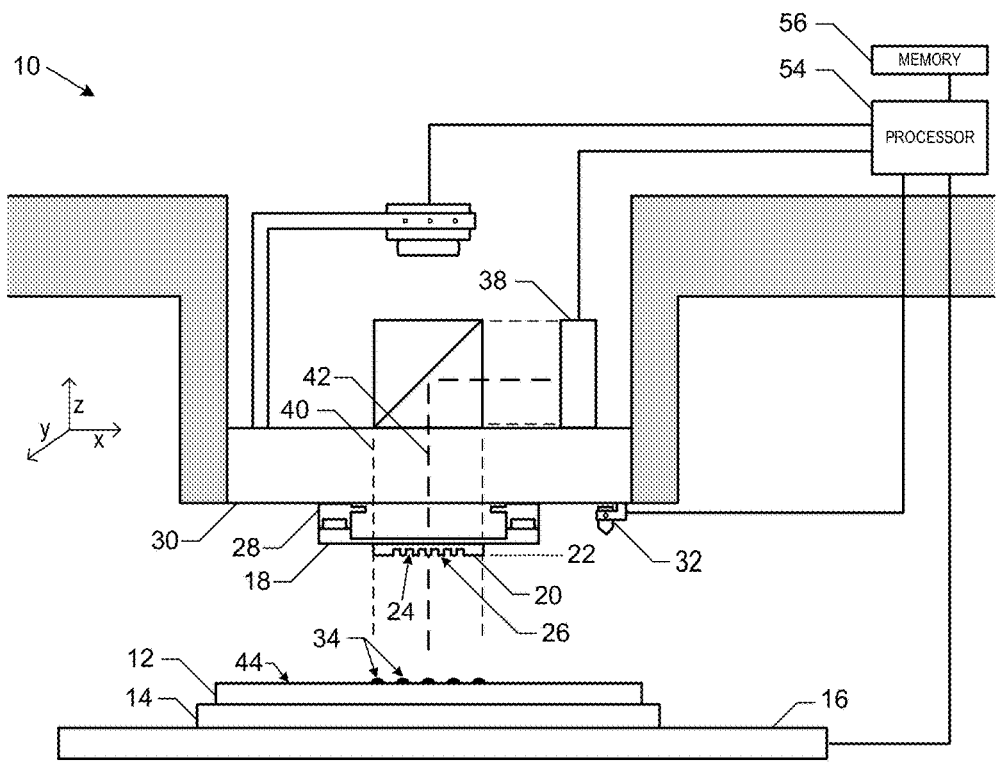
FIG. 1 illustrates a simplified side view of a nanoimprint lithography system having a template and a mold spaced apart from a substrate.

Referring to the figures, and particularly to FIG. 1, illustrated therein is a nanoimprint lithography system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12, with mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. No. 7,157,036 and U.S. Pat. No. 8,076,386, both of which are herein incorporated by reference.

Figure 2:
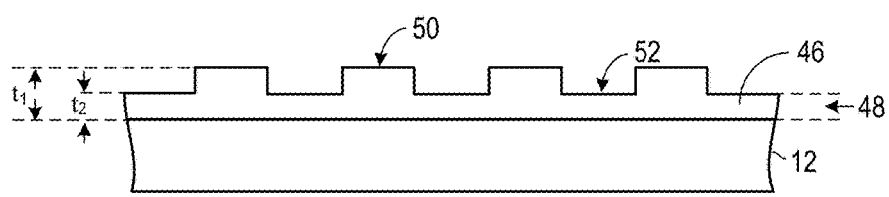
FIG. 2 illustrates a simplified view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

In the present invention, such systems and processes are further adapted to incorporate alpha particle ionizers to generate airborne ions that effectively discharge nanoimprint template and substrate working surfaces. In particular, the incorporation of such alpha particle ionizers are advantageous in nanoimprint lithography as they eliminate the electrostatic charge generated during separation of a template from the imprinted material on the substrate, which in turn reduces the collection of particles on the template surface and on the substrate, that would otherwise be attracted electrostatically. Reduction of attracted and trapped particles in turn reduces process defects that would otherwise occur. At the same time, such ionizers provide for high ion efficiency within a useful working range, leading to fast discharge rates that are compatible with high throughput requirements of nanoimprint lithography.

Alpha particle ionizers in particular produce high energy double ionized helium atoms, He++(also referred to as double charged helium ions or alpha-particles). The double charged helium ions are positively charged and have very high ionization efficiency in air due to the double electric charge and related high particle collision cross-sections (effective geometrical cross-sectional area of the particle), and due to the mass of He atom comparable with the mass of excited atoms. The latter is explained by classical mechanics as an optimal condition for the energy transfer during collision of two particles. The maximum energy transfer happens when these two particles have similar mass. Both $^{241}$Am and $^{210}$Po are good emitters of He atoms and useful in the present invention. Although $^{241}$Am has lower specific activity than $^{210}$Po, the same effective emission can be produced with $^{241}$Am simply by using more of the $^{241}$Am material. It will further be appreciated that other alpha particle emitters can also be used. The number of ions produced by an alpha particle depends on its energy. Within a narrow range of energy, e.g., ~5.3 MeV for $^{210}$Po and ~5.5 MeV for $^{241}$Am, the number of ions produced per each alpha particle is approximately the same. The average stopping range of alpha particles with energies of ~5.3 MeV (for $^{210}$Po) or ~5.5 MeV (for $^{241}$Am) is approximately 3.4 cm in air. The maximum distance ($d_{max}$) the alpha particle can travel in air at room temperature and atmospheric pressure is ~4.2 cm. Thus, any effective working distance within 4.2 cm can be chosen, including, e.g., the average stopping range value of 3.4 cm.

Figure 3:
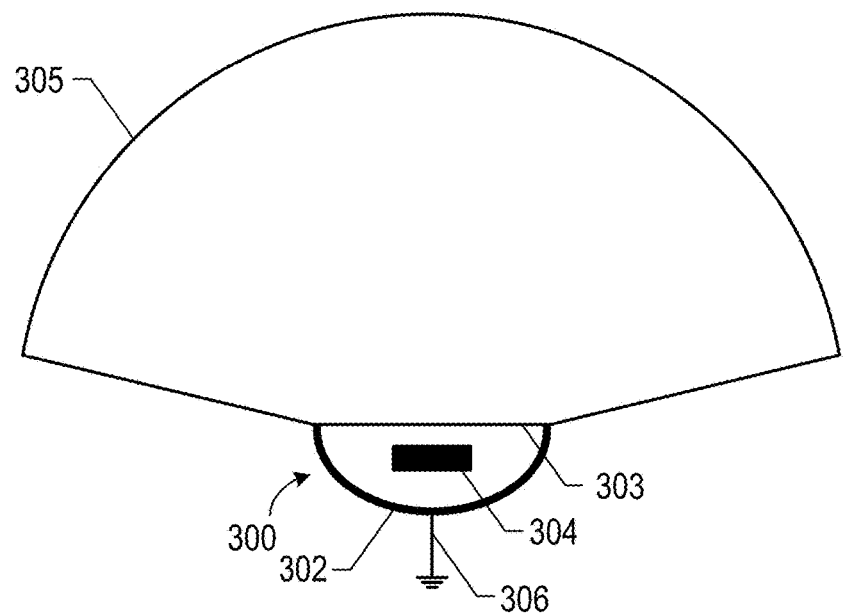
FIG. 3 illustrates a simplified side view of an alpha particle ionizer according to an embodiment of the invention.

FIG. 3 shows schematically alpha particle ionizer 300 with plasma field 305 created around it. Ionizer 300 is made of a solid metal (e.g., stainless steel) body 302 through which alpha particles cannot penetrate and opening 303 through which alpha particles can be released. Active metal piece 304 containing $^{210}$Po is positioned within conductive body 302 and actively emits alpha particles through opening 303. Alternatively, opening 303 can be covered by a conductive metal mesh or screen (not shown) to protect metal piece 304 from damage. In operation, opening 303 allows the alpha particles to travel outward in a desired direction and create an electrically neutral plasma field 305 of desired dimensions extending to the stopping range of the alpha particles, while body 302 restricts alpha particle emission in unwanted directions. As depicted, body 302 is essentially a cylinder with an oval cross-section that is halved longwise such that opening 303 is a rectangular, although other configurations of the ionizer body will be readily apparent for yielding openings of differing desired geometries. Plasma field 305 can be generated in any suitable gas environment, including air or helium which has certain added advantages for nanoimprint lithography as further detailed herein. Plasma field 305 consists of positive and negative ions that move directionally when an external electric field is applied. The plasma is electrically conductive and can be used to remove electric charge as if it was an electrically conductive metal wire.

Figure 4:
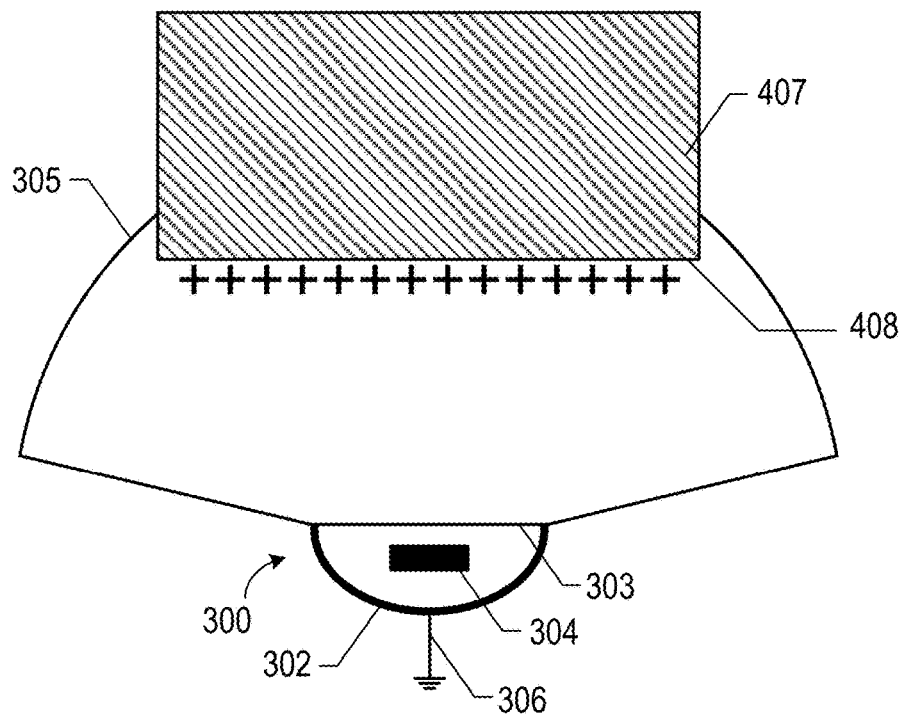
FIG. 4 illustrates the alpha particle ionizer of FIG. 3 discharging a charged surface.

FIG. 4 shows schematically a discharge process for electrostatically charged surface 408 of object 407. As depicted, surface 408 is positively charged although in the alternative the surface can be negatively charged. Metal wire or conductor element 306 connects body 302 of ionizer 300 to ground. Object 407 and ionizer 300 are placed relative to one another such that ionizer 300 is within a working distance of ~3.4 cm from charged surface 408. The working distance can be altered as necessary so long as the working distance remains less than the maximum travel range of alpha particles of ~4.2 cm. As shown, charged surface 408 is completely immersed in conducting and electrically neutral plasma field 305, which thereby discharges surface 408 by conducting electric current flow from the charged surface to ground. We use herein the accepted definition of the current flow direction as the direction of flow of positive ions, thus if the surface is charged negatively then the electric current flows from the ground to the surface. The electrically neutral plasma electrically connects the charged surface 408 and ground through conductive body 302 and grounded conductor 306. In FIG. 4, the ionizer itself is grounded. Alternatively, a separately grounded conductor element can be positioned in proximity to the ionizer and generated plasma field to likewise provide for an electrical connection to ground such that electric current flow is established to discharge the charged surface 408.

Figure 5A:
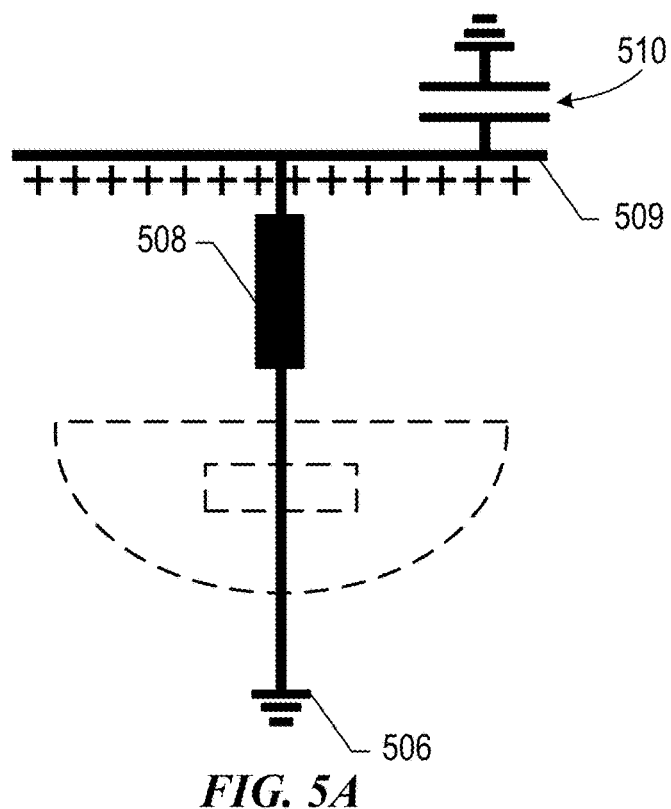
FIGS. 5A and 5B illustrate equivalent electric circuits for the alpha particle ionizer of FIG. 4 discharging a charged surface.
Figure 5B:
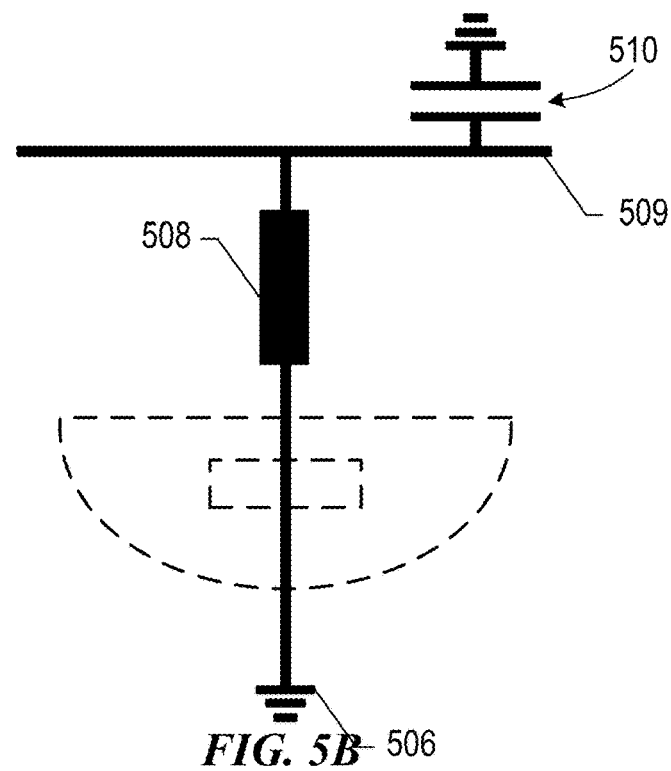

FIGS. 5A-5B show an equivalent discharge scheme for ionizer 300. In this depiction electrically neutral and conductive plasma generated by alpha particles is represented by resistive wire 508 having electrical resistance, R, similar to the electric resistance of plasma. The electric resistance of the neutral plasma depends on the intensity of the alpha particle flux and the working distance between ionizer 300 and charged surface 408. The charged surface 408 in FIG. 4 is represented in FIG. 5A as conductive surface 509. Conductive surface 509 has an effective electric capacitance, C, 510 that is formed between surface 509 and ground. Note that here the value and sign (positive) of the surface charge remains the same as on surface 408 of FIG. 4, although alternatively the charge can differ in value and be of opposite sign. The characteristic discharge time, it depends on plasma resistance, R, and conductive surface capacitance, C, as provided in formula (1) below:

$$\tau_1 = R \cdot C \quad (1)$$

FIG. 5B shows the same equivalent scheme as in FIG. 5A with surface 509 already discharged. The electric charge depicted in FIG. 5A has leaked to ground through resistance R and with characteristic discharge time $\tau_1$=RC.

The typical electric capacitance between a charged patterning surface of a nanoimprint template (having a stamp or field area 26 mm×33 mm) and an ionizer as described herein, and which are positioned at a gap distance of 3.4 cm from one another, is estimated at around C=0.2 pF. The lowest plasma resistance is estimated as R~2×10$^6$Ω. That gives the characteristic discharge time $\tau_1$~4×10$^{-7}$ s (=0.4 microseconds). Due to recombination of positive and negative ions and depending on humidity, and air pressure there is an uncertainty in the estimate of the ions concentration in air, and ion mobilities. That leads in turn to some uncertainty in the plasma resistance (the value that is inverse to plasma conductance) estimate. The resistance, R, on the high side is estimated as 2×10$^{11}$Ω. The discharge time in this case is $\tau_1$~4×10$^{-2}$ s (=40 milliseconds) which is still acceptable for nanoimprint processes. As the electric capacitance for a given specific nanoimprint template is fixed, the discharge time will mostly depend on plasma resistance R. The latter depends on the activity of the alpha particle source, ion recombination rate, the working distance between ionizer and the target surface, air or other gas composition, temperature and humidity.

In particular approaches, a helium gas environment can be employed instead of air. Imprint lithography tools use helium gas routinely for imprint processes. Thus there may be situations when discharge is required in helium environment. In this situation, ionization is still effective, as plasma resistivity will increase only ~6 times. This increase in value still gives reasonable discharge times. Incorporation of an alpha particle ionizer into a nanoimprint lithography system provides for a number of process advantages over other ionization schemes. First, an alpha particle ionizer does not produce massive particulates that can adversely affect the imprint template and/or the imprint quality and/or subsequent processing. For instance, ionizers based on coronary discharge from sharp metal tips produce particulates from decaying of the tip. Coronary discharge oxidizes the metal tip and creates particulates through oxide cracking. Rather, an alpha particle ionizer simply produces helium atoms. That is, as the alpha particle (or double charged He atom, He++) loses its energy, it is neutralized, and converted into helium atom. Helium gas is routinely used in nanoimprint lithography processes to create a local helium atmosphere that mitigates against air trapping. Thus, alpha particle ionizers release helium only, which again is already common to imprint processes and which is otherwise easily dissipated.

Second, the ionization efficiency by alpha particles of any gas, including helium and/or air, is much higher than the ionization efficiency for penetrating radiation like γ-rays, x-rays, beta or UV light. This is because the energy exchange in a collision of two near identical in mass particles is more effective than for particles with very dissimilar weights. An alpha particle with a mass of 4 a.u. faster loses its energy to the He (4 a.u.) and/or air making atoms (average mass ~14.5 a.u.). That is why an alpha particle ionizer produces ~1,000 times more ions per unit of air volume than a typical soft x-ray source. The charged surface discharges ~1,000 times faster with the use of alpha particle ionizer as compared to γ-rays, x-rays, beta or UV light.

Due to the high ionization efficiency, and effective energy loss the alpha particles have a short stopping distance in air, ~3.4 cm, with the maximum travel range 4.2 cm [5]. In helium environment the maximum travel range of alpha particles is ~25 cm. This makes the usage of alpha particle ionizer safe for nearby operating personnel and for the surrounding working equipment. The radiation does not propagate farther than ~4.2 cm in air. Thus the emitter can be placed in the open space as long as there is adequate air space around it (i.e., greater than the maximum travel range of ~4.2 cm in air), and not cause any harmful or deleterious radiation exposure. (Alternatively, the alpha particle ionizer can be completely enclosed within metal shield while not in use and/or placed for storage.) At the same time, the effective working range, such as, for example, the stopping range of 3.4 cm, is far enough from the surface to be discharged and not to worry about tight space clearance between the ionizer and the discharging surface.

The alpha particle ionizers produce neutral electric plasma directly between the surface to be discharged and grounded metal surface of the alpha particle ionizer or any other grounded metal that is within the plasma volume. The neutral plasma is electrically conductive. The plasma is intentionally generated in the space between the surface to be discharged and the alpha ionizer. Once in contact with the plasma, the surface charge flows through plasma to ground. On the contrary, coronary discharge ionizers produce ions near the discharge tip, which then have to be actively spread through air movement. Those moving ions, once delivered to the charged surface, recombine with the surface charged ions to discharge, a much slower process. Further, the surface to be discharged is physically removed and separate from the discharge tip. This separation leads to significant reduction of available ions reaching the charged surface that further slows the discharge rate.

An alpha particle ionizer with an activity of 250 uCi has a rate of ion generation of $(1.11\pm0.03)\times 10^{11}$ ions/(cm$^3$s) within the stopping range in air of 4.2 cm. The electrically neutral plasma makes the space between the emitter and the surface to be discharged a good electric conductor. The typical plasma ion density is in the range of $3\times 10^8$ ions/cm$^3$-$1.2\times 10^{11}$ ions/cm$^3$ depending on air conditions like temperature and humidity. High ion concentration facilitates the quick discharge of the electrostatic surface charge to the ground, providing for template surface discharge in at least less than 1 second, and more usually in the range of 10 ms to 100 ms. On the contrary, ionizing techniques that use the x-rays, γ-rays, etc. produce very low ion concentration. The highest air ionization efficiency among γ-radiation, x-rays, and UV light is attained by x-rays. Soft x-rays produce ~$1\times 10^8$ ions/(cm$^3$s). Hard x-rays and γ-rays produce much less than $1\times 10^8$ ions/(cm$^3$s). At this ionization efficiency, it takes up to tens of seconds to a few minutes to discharge a charged template or substrate surface.

Third, most imprint lithography processes typically use glass templates. Glass has high diffusion and permeability coefficients for helium. A typical glass template will have nanometer sized pores that facilitate diffusion of helium. Thus, helium produced in a glass template via alpha particle implantation (bombardment and the following trapping) and neutralization won't accumulate to a high concentration as opposed to the other implantation ions used in the industry (H+, Ar+, etc.). Accumulation of those ions in glass leads to formation of voids in glass, glass cracking, and distortion. Rather, the produced helium easily diffuses and migrates out of the glass leaving it intact. Thus a further advantage of using alpha particles for plasma generation is that they do not damage glass templates over time. This is a very important advantage in the template replication imprint process where the master template and the formed replica template are both made of glass. The same consideration of high helium permeability is also useful for imprinted resist. The latter is very vitreous material. That is, after neutralization the helium atoms will migrate out quickly out of the cured imprint resist as well, whereas other types of ions will accumulate in the resist creating voids, stress and distortion.

Fourth, the alpha ionizers do not require air flow to move ions to the charged template surface as is the case for coronary discharge ionizers. The latter require air movement in order to spread generated ions through the apparatus to the desired surface to be discharged. Such air flow significantly increases the chances of introducing contaminating particulates into the imprint area. These particulates will undermine the quality of imprints, and cause imprint defects. Alpha ionizers better match the imprint process requirements as they do not produce particulates, nor do they inadvertently introduce particulates by required air flows.

Figure 6:
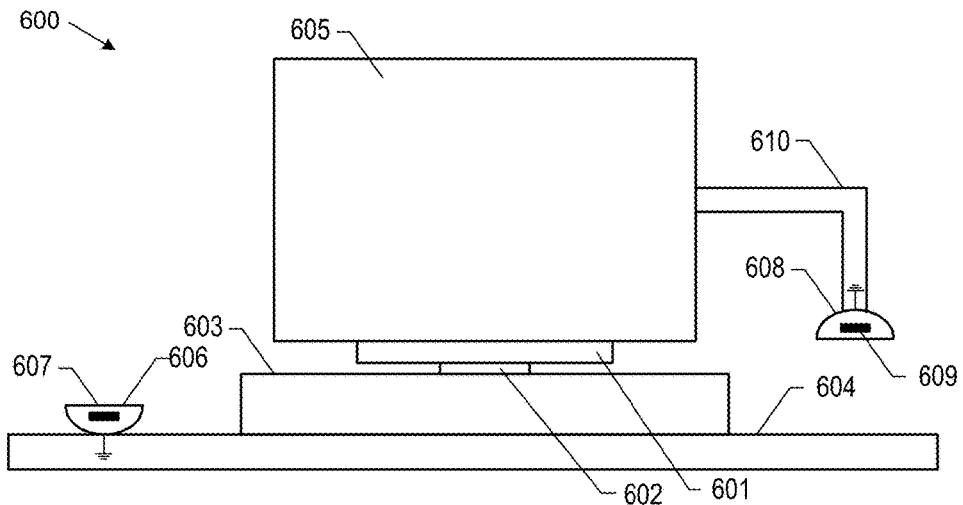
FIGS. 6 and 7 illustrate a simplified side view of a nanoimprint lithography system incorporating alpha particle emitters according to an embodiment of the invention.
Figure 7:
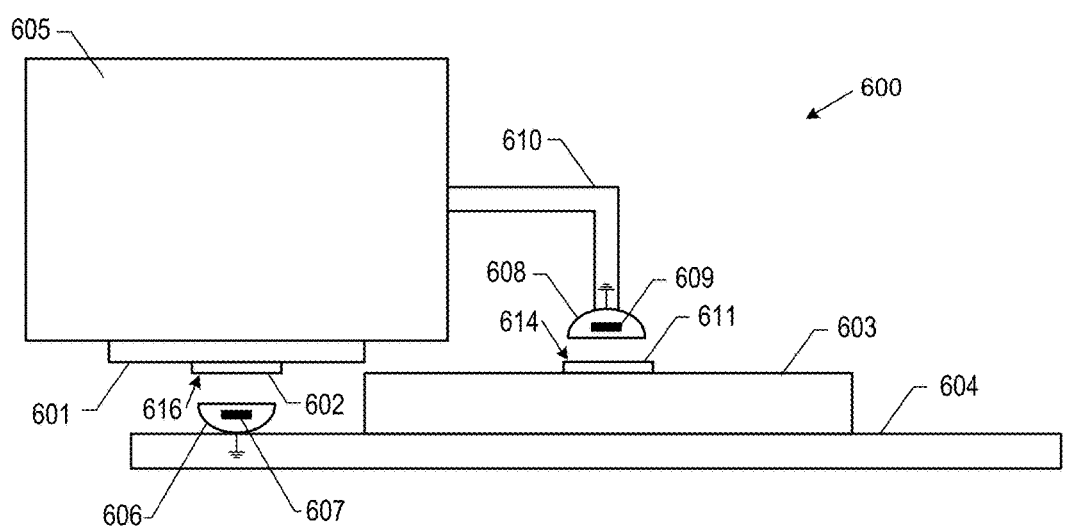

FIGS. 6-8 depict a nanoimprint lithography system similar to that described in FIGS. 1-2 and further incorporating alpha particle ionizers as have been previously described. System 600 includes imprint head 605 with motion stage 604 positioned in proximity to imprint head 605. Imprint head 605 includes a template chuck (not shown) for coupling template 601 having mesa with patterning surface 602 located thereon to imprint head 605. Motion stage 604 likewise includes a substrate chuck (not shown) for retaining substrate 603. Imprint head 605 and motion stage 604 are moveable relative to one another both in the z direction to bring template 601 and substrate 603 into and out of contact (in order to imprint field 611 on substrate 603) as well as in the x-y direction so as to translate template 601 and substrate 603 relative to one another in the x-y direction. First alpha particle ionizer 606 containing active metal 607 is arranged facing upward on motion stage 604 at a spaced apart location from substrate 603 (and substrate chuck). Second alpha ionizer 608 containing active metal 609 is connected to imprint head 605 by arm 610 and arranged facing downward. Both first and second alpha ionizers 606 and 608 are electrically grounded. As will be further explained, by movement of motion stage 604 in the x-y plane, first alpha ionizer 606 is positioned directly under surface 616 of template 601 for discharge, and surface 614 of imprinted field 611 is positioned for discharge directly under second alpha ionizer 608.

As the imprint process finishes and template 601 is separated from imprinted field 611 on substrate 603, an electrostatic charge is generated on template surface 616 and imprinted field surface 614. Stage 604 is then moved in the x-y plane in such a way that the first alpha ionizer 606 is positioned just below the surface 616 of template 602 and imprinted field 611 is positioned just below the second alpha ionizer 608, each at a working distance d effective for discharge (compare FIGS. 6 and 8A with FIGS. 7 and 8B). An average working distance, d, in air is ~3.4 cm. Stage 604 can move to this position for a very short period of time, $\tau_2$ that is effective to complete discharge of the template 602 and imprinted field 611. Alternatively, stage 604 can move with some non-zero velocity in the x-y plane that still allows enough time, $\tau_2$, for complete discharge. In either approach:

$$\tau_2 \geq \tau_1 \qquad (2)$$

That is, $\tau_2$ is greater than or at least equal to characteristic discharge time $\tau_1$. Where $\tau_2$ is greater than $\tau_1$, the inequality (2) is taken into consideration when establishing the velocity of stage 604 during discharge.

Figure 8A:
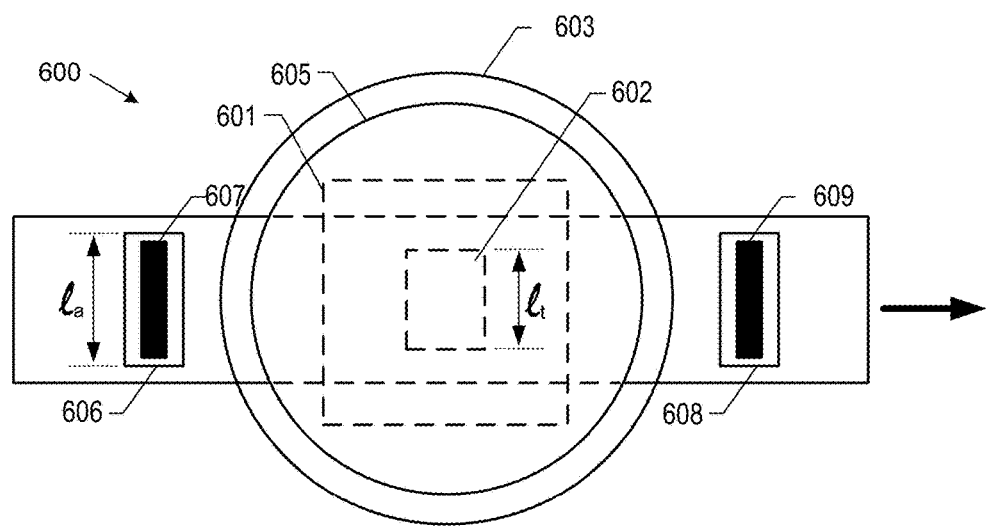
FIGS. 8A and 8B illustrate top down views of the nanoimprint lithography system of FIGS. 6 and 7.
Figure 8B:
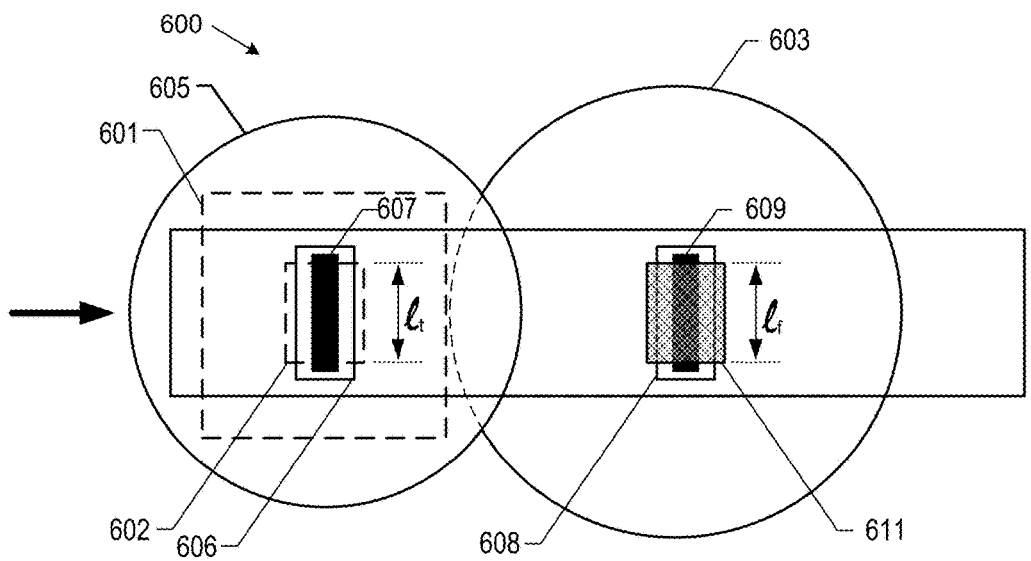

With particular reference to FIGS. 8A and 8B, it can be seen that for optimal discharging, length $l_a$ of active material 607 and 609 should be greater than the corresponding length $l_t$ of template patterning surface 602 or length $l_f$ of imprint field 611, respectively. In such case, it can be assured that both charged surfaces will be uniformly exposed to the electrically neutral plasma field produced by ionizers 606 and 608. Alternatively, length $l_a$ of active material 607 or 609 can be shorter than the imprint field dimension, provided that the dimensions of the generated plasma field expose the entirety of the charged surface to the plasma.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprint lithography apparatus comprising:
   an imprint head having a template chuck configured to retain an imprint template having a patterning surface;
   a motion stage having a substrate chuck, the substrate chuck configured to retain an imprint lithography substrate, the motion stage translatable relative to the imprint head so as to bring a retained substrate or a location thereon into and out of superimposition with the patterning surface of the retained template;
   a first alpha particle emitter and a grounded conductor coupled to the motion stage and further arranged such that translational movement of the motion stage brings the first alpha particle emitter and the grounded conductor into superimposition with the patterning surface of the retained template, wherein the first alpha particle emitter when so positioned operates to create an electrically neutral plasma field between the patterning surface of the imprint template and the grounded conductor to discharge electric charge on the patterning surface of the imprint template to ground, wherein active metal of the first alpha particle emitter is arranged to face the patterning surface of the template when discharging electric charge on the patterning surface of the imprint template;
   wherein, when the first alpha particle emitter and the grounded conductor are in superimposition with the patterning surface of the retained template, a second alpha particle emitter is arranged to face the substrate retained by the substrate chuck.

2. The apparatus of claim 1 wherein both the grounded conductor and the first alpha particle emitter comprise portions of a first alpha-ionizer.

3. The apparatus of claim 1 wherein the grounded conductor is separate from and located proximal to the first alpha particle emitter.

4. The apparatus of claim 1 wherein the created neutral electric plasma field has a density of $3 \times 10^8$ ions/cm$^3$ to $1.2 \times 10^{11}$ ions/cm$^3$ at the patterning surface of the retained template.

5. The imprint lithography apparatus of claim 1, wherein the second alpha particle emitter when arranged to face the substrate operates to create an electrically neutral plasma field between the retained substrate or location thereon and a second grounded conductor to discharge electric charge on the retained substrate or location thereon to ground.

6. The apparatus of claim 5 wherein both the second grounded conductor and the second alpha particle emitter comprise portions of the second alpha-ionizer.

7. The apparatus of claim 5 wherein the second grounded conductor is separate from and located proximal to the second alpha particle emitter.

8. The apparatus of claim 5 wherein the created neutral electric plasma field has a density of $3 \times 10^8$ ions/cm$^3$ to $1.2 \times 10^{11}$ ions/cm$^3$ at the retained substrate or location thereon.

9. The imprint lithography apparatus of claim 5 wherein in the second alpha particle emitter is coupled to the imprint head.

10. A method of discharging electrostatic charge on an imprint lithography template patterning surface, the method comprising the steps of:
   bringing a patterning surface of an imprint lithography template into contact with polymerizable material deposited on an imprint lithography substrate;
   solidifying the polymerizable material to form a patterned layer on the substrate;
   separating the template from the formed patterned layer; and
   after separating, positioning the template in superimposition with an alpha particle emitter and a grounded conductor such that the alpha particle emitter creates an electrically neutral plasma field between the template patterning surface and the grounded conductor and maintaining such positioning for a predetermined discharge time so as to discharge electrostatic charge on the template patterning surface, wherein active metal of the alpha particle emitter is arranged to face the retained substrate or location thereon when discharging electric charge on the patterning surface of the imprint template, and wherein, when the first alpha particle emitter and the grounded conductor are in superimposition with the patterning surface of the retained template, a second alpha particle emitter is arranged to face the substrate retained by the substrate chuck.

11. The method of claim 10 wherein the predetermined discharge time is less than 1 second.

12. The method of claim 10 further comprising the step of, after separating, positioning the substrate in superimposition with the second alpha particle emitter and an additional grounded conductor that creates an electrically neutral plasma field between the retained substrate or location thereon and the additional grounded conductor to discharge electric charge on the retained substrate or location thereon and maintaining such positioning for a predetermined discharge time so as to discharge electrostatic electricity on the formed patterned layer on the substrate.

13. The method of claim 12 wherein the predetermined discharge time is less than 1 second.

14. The method of claim 10 wherein the alpha particle emitter operates to create $He^{++}$ at a density of $3\times10^8$ ions/cm$^3$ to $1.2\times10^{11}$ ions/cm$^3$ at the template patterning surface or the formed patterned layer surface.

15. The method of claim 10 wherein the substrate is glass.

16. The method of claim 10 wherein the steps of bringing the imprint lithography template patterning surface into contact with the polymerizable material and solidifying the polymerizable material are performed in a He environment.

17. A method of manufacturing a device comprising:
transferring a pattern into a substrate using an apparatus according to claim 1; and
processing the substrate to manufacture the device.

18. A method of manufacturing an imprint lithography replica template comprising:
transferring a pattern into a glass substrate using an apparatus according to claim 1; and
processing the substrate to manufacture the replica template.

19. The apparatus of claim 7 wherein the grounded conductor is separate from and located proximal to the first alpha particle emitter.

20. An imprint lithography apparatus comprising:
an imprint head having a template chuck configured to retain an imprint template having a patterning surface;
a motion stage having a substrate chuck, the substrate chuck configured to retain an imprint lithography substrate, the motion stage translatable relative to the imprint head so as to bring a retained substrate or a location thereon into and out of superimposition with the patterning surface of the retained template;
a first and second active metal piece, wherein the first and second active metal piece are a piece of metal that emits alpha particles, and a grounded conductor coupled to the motion stage and further arranged such that translational movement of the motion stage brings the first active metal piece and the grounded conductor into superimposition with the patterning surface of the retained template, wherein the first active metal piece when so positioned operates to create an electrically neutral plasma field between the patterning surface of the imprint template and the grounded conductor to discharge electric charge on the patterning surface of the imprint template to ground, wherein the first active metal piece is arranged to face the patterning surface of the template when discharging electric charge on the patterning surface of the imprint template, and wherein, when the first active metal piece and the grounded conductor are in superimposition with the patterning surface of the retained template, a second active metal piece is arranged to face the substrate retained by the substrate chuck.

21. The apparatus of claim 1 wherein when discharging, an opening in a solid metal body of the first alpha particle emitter is arranged to face the patterning surface of the template, wherein the opening allows alpha particles to travel outward.

* * * * *